(12) United States Patent
He et al.

(10) Patent No.: US 10,403,201 B2
(45) Date of Patent: Sep. 3, 2019

(54) PIXEL DRIVING CIRCUIT, PIXEL DRIVING METHOD, DISPLAY PANEL AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Xiaoxiang He, Beijing (CN); Bo Wu, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 345 days.

(21) Appl. No.: 15/322,463

(22) PCT Filed: Jul. 4, 2016

(86) PCT No.: PCT/CN2016/088381
§ 371 (c)(1),
(2) Date: Dec. 28, 2016

(87) PCT Pub. No.: WO2017/117940
PCT Pub. Date: Jul. 13, 2017

(65) Prior Publication Data
US 2018/0218676 A1 Aug. 2, 2018

(30) Foreign Application Priority Data
Jan. 4, 2016 (CN) .......................... 2016 1 0005028

(51) Int. Cl.
*G09G 3/3233* (2016.01)
*G09G 3/3258* (2016.01)
(Continued)

(52) U.S. Cl.
CPC ......... *G09G 3/3233* (2013.01); *G09G 3/3258* (2013.01); *G09G 3/3266* (2013.01);
(Continued)

(58) Field of Classification Search
CPC combination set(s) only.
See application file for complete search history.

(56) References Cited

U.S. PATENT DOCUMENTS

2005/0259051 A1 11/2005 Lee et al.
2006/0038754 A1 2/2006 Kim
(Continued)

FOREIGN PATENT DOCUMENTS

CN 1728219 A 2/2006
CN 1734532 A 2/2006
(Continued)

OTHER PUBLICATIONS

First Office Action for Chinese Application No. 201610005028.3, dated Jul. 28, 2017, 8 Pages.
(Continued)

*Primary Examiner* — Robin J Mishler
(74) *Attorney, Agent, or Firm* — Brooks Kushman P.C.

(57) ABSTRACT

The present disclosure provides a pixel driving circuit, a pixel driving method, a, display panel and a display device. The pixel driving circuit includes a driving transistor, a storage capacitor, a switching control module, a writing control module and a light-emission control module. A gate electrode of the driving transistor is electrically connected to a first electrode of the driving transistor at a threshold compensation stage and a writing stage under the control of
(Continued)

the switching control module, so as to write a threshold voltage of the driving transistor into the storage capacitor. A data voltage is written into a second electrode of the driving transistor at the writing stage under the control of the writing control module. According to the present disclosure, the threshold voltage of the driving transistor and the data voltage from the data line are separately written into the storage capacitor through the switching control module and the writing control module, so as to enable a driving current of the driving transistor to be independent of the threshold voltage of the driving transistor. In addition, a reference voltage is written into a second end of the storage capacitor at the writing stage through the writing control module, and the driving current of the driving transistor is enabled to be independent of an on-state voltage of a light-emitting element at a light-emission maintenance stage.

19 Claims, 7 Drawing Sheets

(51) Int. Cl.
$G09G\ 3/3266$ (2016.01)
$G09G\ 3/3275$ (2016.01)
$H01L\ 27/32$ (2006.01)

(52) U.S. Cl.
CPC ....... G09G 3/3275 (2013.01); H01L 27/3276 (2013.01); *G09G 2300/0809* (2013.01); *G09G 2330/028* (2013.01)

(56) References Cited

U.S. PATENT DOCUMENTS

| | | |
|---|---|---|
| 2006/0244695 A1 | 11/2006 | Komiya |
| 2007/0103406 A1 | 5/2007 | Kim |
| 2007/0126680 A1 | 6/2007 | Han et al. |
| 2015/0187276 A1 | 7/2015 | Shim et al. |
| 2015/0221252 A1 | 8/2015 | Qing et al. |
| 2016/0189606 A1* | 6/2016 | Chen .................... G09G 3/3233 345/214 |
| 2016/0307502 A1 | 10/2016 | Nie |

FOREIGN PATENT DOCUMENTS

| | | |
|---|---|---|
| CN | 1874627 A | 12/2006 |
| CN | 102222468 A | 10/2011 |
| CN | 103440843 A | 12/2013 |
| CN | 104658483 A | 5/2015 |
| CN | 104751781 A | 7/2015 |
| CN | 105427805 A | 3/2016 |
| CN | 205282058 U | 6/2016 |
| KR | 20070049907 A | 5/2007 |

OTHER PUBLICATIONS

International Search Report and Written Opinion for Application No. PCT/CN2016/088381, dated Sep. 20, 2016, 11 Pages.

* cited by examiner

PIXEL DRIVING CIRCUIT, PIXEL DRIVING METHOD, DISPLAY PANEL AND DISPLAY DEVICE

CROSS-REFERENCE TO RELATED APPLICATIONS

This application is the U.S. national phase of PCT Application No. PCT/CN2016/088381 filed on Jul. 4, 2016, which claims priority to Chinese Patent Application No. 201610005028.3 filed on Jan. 4, 2016, the disclosures of which are incorporated in their entirety by reference herein.

TECHNICAL FIELD

The present disclosure relates to the field of display technology, in particular to a pixel driving circuit, a pixel driving method, a display panel and a display device.

BACKGROUND

An active matrix organic light-emitting diode (AMO-LED) is driven by a current generated by a driving transistor in a saturated state, so as to emit light. In the case that an identical grayscale voltage is applied to the driving transistor, different driving currents, i.e., current unevenness, may occur due to different critical voltages. For a low temperature poly-silicon (LTPS) process, it is impossible to provide the driving transistor with a constant threshold voltage Vth, and meanwhile voltage drift may easily occur for the threshold voltage Vth, so it is impossible for a traditional 2T1C (two transistors and one capacitor)-based pixel driving circuit to provide even brightness. In addition, for the existing pixel driving circuit, the driving current of the driving transistor is related to an on-state voltage of the OLED, and along with the aging of the OLED, this on-state voltage may change too, so the driving current of the driving transistor may be adversely affected by the aging of the OLED.

SUMMARY

A main object of the present disclosure is to provide a pixel driving circuit, a pixel driving method, a display panel and a display device, so as to enable a driving current of a driving transistor to be independent of a threshold voltage of the driving transistor, and prevent the driving current of the driving transistor from being adversely affected by the aging of a light-emitting element.

In one aspect, the present disclosure provides in some embodiments a pixel driving circuit, including a driving transistor, a storage capacitor, a switching control module, a writing control module and a light-emission control module. A gate electrode of the driving transistor is connected to a first electrode of the driving transistor through the switching control module, the first electrode thereof is configured to receive a first power source voltage through the light-emission control module, and a second electrode thereof is connected to a light-emitting element through the light-emission control module and connected to a data line through the writing control module. A first end of the storage capacitor is connected to the gate electrode of the driving transistor, and a second end thereof is connected to the second electrode of the driving transistor through the light-emission control module and configured to receive a reference voltage through the writing control module. The switching control module is configured to receive a switching control signal and enable, at a threshold compensation stage and a writing stage of each display period, the gate electrode of the driving transistor to be electrically connected to the first electrode of the driving transistor under the control of the switching control signal, so as to enable the driving transistor to function as a diode, thereby to write a threshold voltage of the driving transistor into the storage capacitor. The writing control module is configured to receive a scanning signal and enable, at the writing stage of each display period, to write a data voltage from the data line into the second electrode of the driving transistor and write the reference voltage into the second end of the storage capacitor under the control of the scanning signal. The light-emission control module is configured to receive a light-emission control signal and enable, at the threshold compensation stage and a light-emission maintenance stage of each display period, the first electrode of the driving transistor to receive the first power source voltage under the control of the light-emission control signal and enable the second electrode of the driving transistor to be electrically connected to the light-emitting element.

In a possible embodiment of the present disclosure, the light-emitting element includes an OLED, an anode of which is connected to the second end of the storage capacitor, and a cathode of which is configured to receive a second power source voltage. At the writing stage of each display period, the reference voltage is smaller than or equal to the second power source voltage.

In a possible embodiment of the present disclosure, the switching control module includes a switching control transistor, a gate electrode of which is configured to receive the switching control signal, a first electrode of which is connected to the first electrode of the driving transistor, and a second electrode of which is connected to the gate electrode of the driving transistor.

In a possible embodiment of the present disclosure, the writing control module includes: a data writing transistor, a gate electrode of which is configured to receive the scanning signal, a first electrode of which is connected to the data line, and a second electrode of which is connected to the second electrode of the driving transistor; and a reference voltage writing transistor, a gate electrode of which is configured to the scanning signal, a first electrode of which is connected to the second end of the storage capacitor, and a second electrode of which is configured to receive the reference voltage.

In a possible embodiment of the present disclosure, the light-emission control module includes: a first light-emission control transistor, a gate electrode of which is configured to receive the light-emission control signal, a first electrode of which is configured to receive the first power source voltage, and a second electrode of which is connected to the first electrode of the driving transistor; and a second light-emission control transistor, a gate electrode of which is configured to receive the light-emission control signal, a first electrode of which is connected to the second electrode of the driving transistor, and a second electrode of which is connected to the light-emitting element.

In a possible embodiment of the present disclosure, the driving transistor, the switching control transistor, the data writing transistor, the reference voltage writing transistor, the first light-emission control transistor and the second light-emission control transistor are all n-type transistors.

In a possible embodiment of the present disclosure, the light-emission control signal is the scanning signal. The light-emission control module includes: a first light-emission control transistor, a gate electrode of which is configured to receive the scanning signal, a first electrode of which is connected to the first electrode of the driving transistor, and a second electrode of which is configured to receive the first power source voltage; and a second light-emission control transistor, a gate electrode of which is configured to receive the scanning signal, a first electrode of which is connected to the light-emitting element, and a second electrode of which is connected to the second electrode of the driving transistor.

In a possible embodiment of the present disclosure, the driving transistor, the switching control transistor, the data writing transistor and the reference voltage writing transistor are all n-type transistors, and the first light-emission control transistor and the second light-emission control transistor are both p-type transistors.

In another aspect, the present disclosure provides in some embodiments a pixel driving method for the above-mentioned pixel driving circuit, including: a threshold compensation step of, at a threshold compensation stage of each display period, enabling the switching control signal and the light-emission control signal to be effective, enabling both the switching control module and the light-emission control module to be in an on state, and enabling the driving transistor to function as a diode, so as to compensate for a threshold voltage Vth of the driving transistor through a voltage difference between the first end and the second end of the storage capacitor; a writing step of, at a writing stage of each display period, enabling the switching control signal and the scanning signal to be effective, enabling both the switching control module and the light-emission control module to be in the on state, and maintaining the driving transistor to function as the diode, so as to write a data voltage Vdata from the data line into the first end of the storage capacitor through the driving transistor, and write a reference voltage Vref into the second end of the storage capacitor; and a light-emission step of, at a light-emission maintenance stage of each display period, enabling the light-emission control signal to be effective, and enabling the light-emission control module to be in the on state, so as to enable the driving transistor to be in the on state through charges stored in the storage capacitor, thereby to drive the light-emitting element to emit light.

In a possible embodiment of the present disclosure, the threshold compensation stage is maintained for a time period smaller than a predetermined value.

In yet another aspect, the present disclosure provides in some embodiments a display panel including the above-mentioned pixel driving circuit.

In still yet another aspect, the present disclosure provides in some embodiments a display device including the above-mentioned display panel.

According to the pixel driving circuit, the pixel driving method, the display panel and the display device in the embodiments of the present disclosure, the threshold voltage Vth of the driving transistor and the data voltage Vdata from the data line may be written separately into the storage capacitor through the switching control module and the writing control module, so as to enable a gate-to-source voltage of the driving transistor to include Vdata+Vth and enable the driving current of the driving transistor to be independent of the threshold voltage Vth of the driving transistor at the light-emission maintenance stage, thereby to provide the even brightness. In addition, the reference voltage may be written into the second end of the storage capacitor through the writing control module at the writing stage, so as to enable the driving current of the driving transistor to be independent of the on-state voltage of the light-emitting element at the light-emission maintenance stage, thereby to prevent the driving current of the driving transistor from being adversely affected by the aging of the light-emitting element at the light-emission maintenance stage.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort. Shapes and sizes of the members in the drawings are for illustrative purposes only, but shall not be used to reflect any actual scale.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
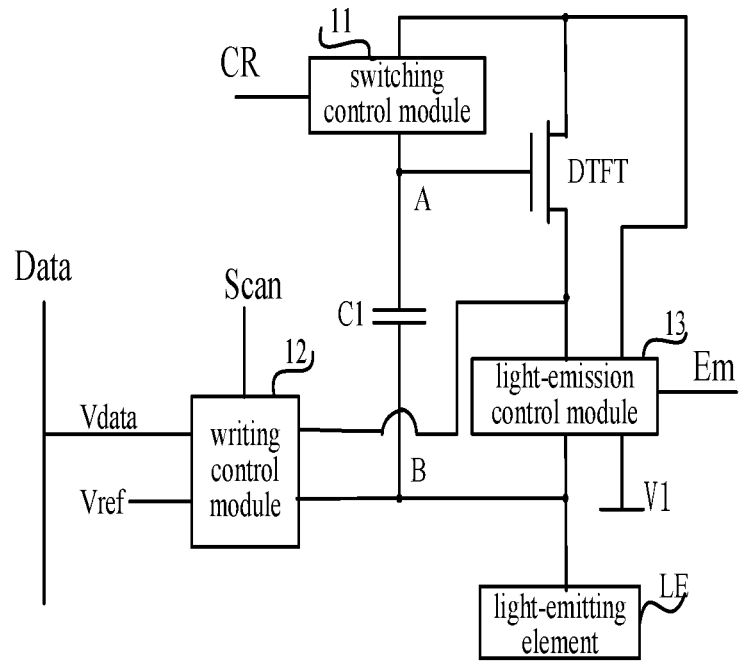
FIG. 1 is a schematic view showing a pixel driving circuit according to some embodiments of the present disclosure.

As shown in FIG. 1, the present disclosure provides in some embodiments a pixel driving circuit, which includes a driving transistor DTFT, a storage capacitor C1, a switching control module 11, a writing control module 12 and a light-emission control module 13. A gate electrode of the driving transistor DTFT is connected to a first electrode of the driving transistor DTFT through the switching control module 11, the first electrode thereof is configured to receive a first power source voltage V1 through the light-emission control module 13, and a second electrode thereof is connected to a light-emitting element LE through the light-emission control module 13 and connected to a data line Data through the writing control module 12. A first end A of the storage capacitor C1 is connected to the gate electrode of the driving transistor DTFT, and a second end B thereof is connected to the second electrode of the driving transistor DTFT through the light-emission control module 12 and configured to receive a reference voltage Vref through the writing control module 12. The switching control module 11 is configured to receive a switching control signal CR and enable, at a threshold compensation stage and a writing stage of each display period, the gate electrode of the driving transistor DTFT to be electrically connected to the first electrode of the driving transistor DTFT under the control of the switching control signal CR, so as to enable the driving transistor DTFT to function as a diode, thereby to write a threshold voltage Vth of the driving transistor DTFT into the storage capacitor C1. The writing control module 12 is configured to receive a scanning signal Scan and enable, at the writing stage of each display period, to write a data voltage Vdata from the data line Data into the second electrode of the driving transistor DTFT under the control of the scanning signal Scan, and to write the reference voltage Vref into the second end B of the storage capacitor C1. The light-emission control module 13 is configured to receive a light-emission control signal Em and enable, at the threshold compensation stage and a light-emission maintenance stage of each display period, the first electrode of the driving transistor DTFT to receive the first power source voltage V1 under the control of the light-emission control signal Em, and the second electrode of the driving transistor DTFT to be electrically connected to the light-emitting element LE.

According to the pixel driving circuit in the embodiments of the present disclosure, the threshold voltage Vth of the driving transistor and the data voltage Vdata from the data line may be written separately into the storage capacitor through the switching control module and the writing control module, so as to enable a gate-to-source voltage of the driving transistor to include Vdata+Vth and enable the driving current of the driving transistor to be independent of the threshold voltage Vth of the driving transistor at the light-emission maintenance stage, thereby to provide the even brightness. In addition, the reference voltage may be written into the second end of the storage capacitor at the writing state through the writing control module, so as to enable the driving current of the driving transistor to be independent of the on-state voltage of the light-emitting element at the light-emission maintenance stage, thereby to prevent the driving current of the driving transistor from being adversely affected by the aging of the light-emitting element at the light-emission maintenance stage.

To be specific, in FIG. 1, the driving transistor DTFT is an n-type transistor. At this time, the first electrode of the driving transistor DTFT is a drain electrode, and the second electrode of the driving transistor DTFT is a source electrode. However, during the actual application, the driving transistor DTFT may also be a p-type transistor.

During the operation of the pixel driving circuit as shown in FIG. 1, at the threshold compensation stage of each display period, under the control of the light-emission control module 13, a voltage V1 is written into the drain electrode of the driving transistor DTFT, and the source electrode of the driving transistor DTFT is electrically connected to the light-emitting element LE. Under the control of the switching control module 11, the gate electrode of the driving transistor DTFT is electrically connected to the drain electrode of the driving transistor DTFT, i.e., the driving transistor DTFT may function as a diode. The driving transistor DTFT is in a saturated state, and a gate-to-source voltage of the driving transistor DTFT is equal to the threshold voltage Vth. At this time, a voltage at the first end A is V1, and a voltage at the second end B is V1−Vth, so a voltage difference between the first end A and the second end B of the storage capacitor C1 is equal to the threshold voltage Vth. As a result, it is able to write the threshold voltage Vth of the driving transistor DTFT into the storage capacitor C1.

At the writing stage of each display period, under the control of the light-emission control module 13, the drain electrode of the driving transistor DTFT is electrically disconnected from a first power source line for outputting the first power source voltage V1, and the source electrode of the driving transistor DTFT is electrically disconnected from the light-emitting element LE. Under the control of the switching control module 11, the gate electrode of the driving transistor DTFT is continuously electrically connected to the drain electrode of the driving transistor DTF, and the driving transistor DTFT is maintained to function as the diode. Under the control of the writing control module 12, Vdata is written into the source electrode of the driving transistor DTFT (so the voltage at the first end A is Vdata+Vth), and the second end B is pulled down to be at the reference voltage Vref under the control of the writing control module 12. The voltage difference between the first end A and the second end B of the storage capacitor C1 is Vdata+Vth−Vref, so the threshold voltage Vth of the driving transistor and the data voltage Vdata are written into the storage capacitor C1. At this time, through the reference voltage Vref, it is able to eliminate the voltage across a terminal of the light-emitting element LE connected to the source electrode of the driving transistor DTFT within a previous frame.

At the light-emission maintenance stage of each display period, under the control of the light-emission control module 13, the drain electrode of the driving transistor DTFT receives the first power source voltage V1, and the source electrode of the driving transistor DTFT is electrically connected to the light-emitting element LE and the second end B of the storage capacitor C1. Under the control of the switching control module 11, the gate electrode of the driving transistor DTFT is electrically disconnected from the drain electrode of the driving transistor DTFT. Under the control of the writing control module 12, the second end B of the storage capacitor C1 stops receiving the reference voltage Vref, and the source electrode of the driving transistor DTFT is electrically disconnected from the data line Data. At this time, the gate-to-source voltage Vgs of the driving transistor DTFT is just the voltage difference between the first end A and the second end B of the storage capacitor C1. The voltage difference between the first end A and the second end B of the storage capacitor C1 does not change suddenly, so the voltage difference between the first end A and the second end B of the storage capacitor C1 may be still equal to Vdata+Vth−Vref at this point. As a result, the driving current of the driving transistor DTFT is independent of the threshold voltage Vth of the driving transistor DTFT.

In addition, at the writing stage, the reference voltage Vref is written into the source electrode of the driving transistor DTFT, so as to enable the gate-to-source voltage of the driving transistor DTFT from being independent of the on-state voltage of the light-emitting element LE at the light-emission maintenance stage even in the case that the voltage at the source electrode of the driving transistor DTFT is equal to the on-state voltage of the light-emitting element LE, thereby to enable the driving current of the driving transistor DTFT from being independent of the on-state voltage of the light-emitting element LE at the light-emission maintenance stage, and prevent the driving current from being adversely affected by the aging of the light-emitting element.

To be specific, in the case that, at the writing stage, the reference voltage Vref is not written into the source electrode of the driving transistor DTFT but the second end B of the storage capacitor C1 is directly electrically connected to the light-emitting element LE, a voltage VB at the second end B of the storage capacitor C1 may be equal to an on-state voltage Vle of the light-emitting element LE at the writing stage, and at this time, the voltage difference between the first end A and the second end B of the storage capacitor C1 is Vdata+Vth−Vle. Because the voltage difference between the two ends of the storage capacitor C1 cannot change suddenly, the voltage difference therebetween at the light-emission maintenance stage may be maintained as Vdata+Vth−Vle. In this regard, the driving current of the driving transistor for driving the light-emitting element to emit light may be related to the on-stage voltage of the light-emitting element, so the driving current may be adversely affected by the aging of the light-emitting element.

Figure 2A:
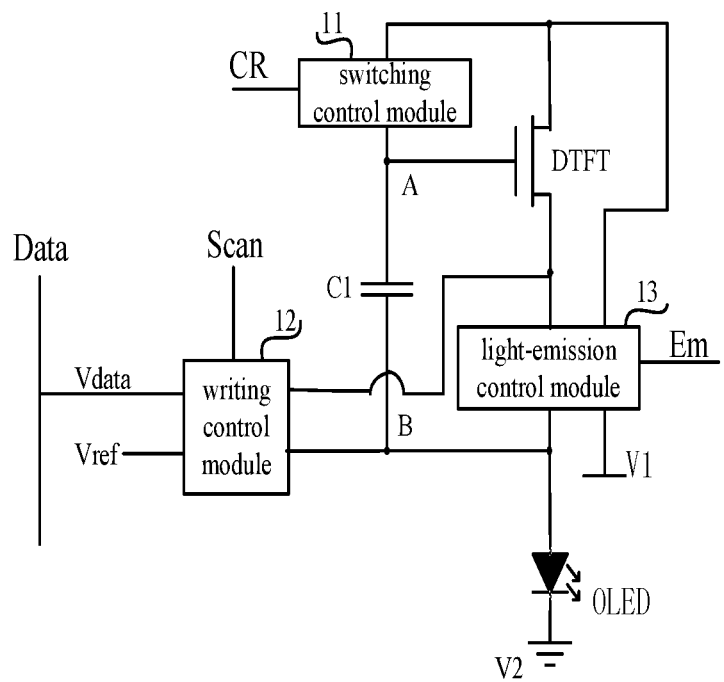
FIG. 2A is another schematic view showing the pixel driving circuit according to some embodiments of the present disclosure.

To be specific, as shown in FIG. 2A, the light-emitting element may include an OLED, an anode of which is connected to the second end of the storage capacitor C1, and a cathode of which is configured to receive a second power source voltage V2.

In a possible embodiment of the present disclosure, at the writing stage of each display period, the reference voltage Vref is smaller than or equal to the second power source voltage V2, so as to enable the OLED not to emit light at the writing stage, thereby to prolong a service life of the OLED.

In a possible embodiment of the present disclosure, the threshold compensation stage is maintained for a time period smaller than a predetermined value. At the threshold compensation stage, the light-emitting element is driven by the driving transistor in the saturated state to emit light, so the time period of the threshold compensation stage needs to be reduced as possible, so as to improve a display effect.

Figure 2B:
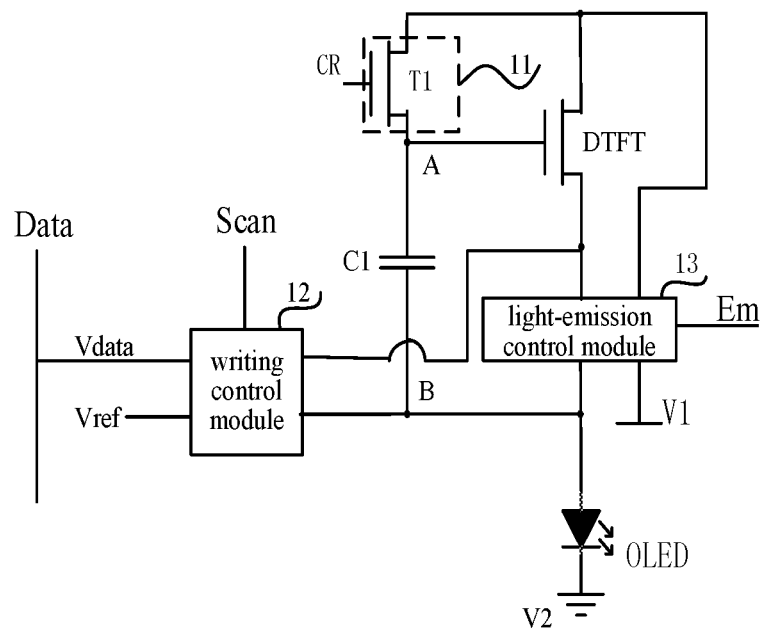
FIG. 2B is yet another schematic view showing the pixel driving circuit according to some embodiments of the present disclosure.

To be specific, as shown in FIG. 2B, the switching control module includes a switching control transistor T1, a gate electrode of which is configured to receive the switching control signal CR, a first electrode of which is connected to the first electrode of the driving transistor DTFT, and a second electrode of which is connected to the gate electrode of the driving transistor DTFT.

As shown in FIG. 2B, the switching control transistor T1 is an n-type transistor.

Figure 2C:
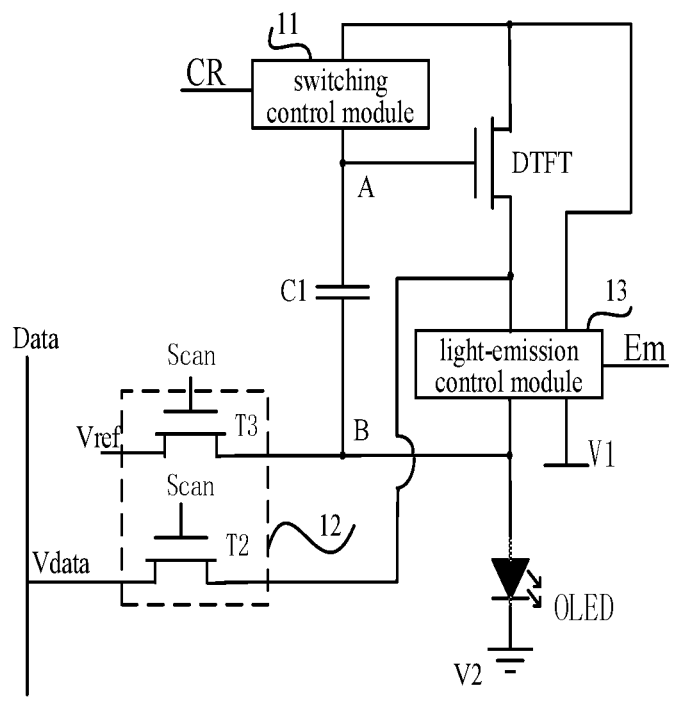
FIG. 2C is still yet another schematic view showing the pixel driving circuit according to some embodiments of the present disclosure.

To be specific, as shown in FIG. 2C, the writing control module includes: a data writing transistor T2, a gate electrode of which is configured to receive the scanning signal Scan, a first electrode of which is connected to the data line Data, and a second electrode of which is connected to the second electrode of the driving transistor DTFT; and a reference voltage writing transistor T3, a gate electrode of which is configured to the scanning signal Scan, a first electrode of which is connected to the second end of the storage capacitor C1, and a second electrode of which is configured to receive the reference voltage Vref.

In FIG. 2C, the data writing transistor T2 and the reference voltage writing transistor T3 are both n-type transistors.

Figure 2D:
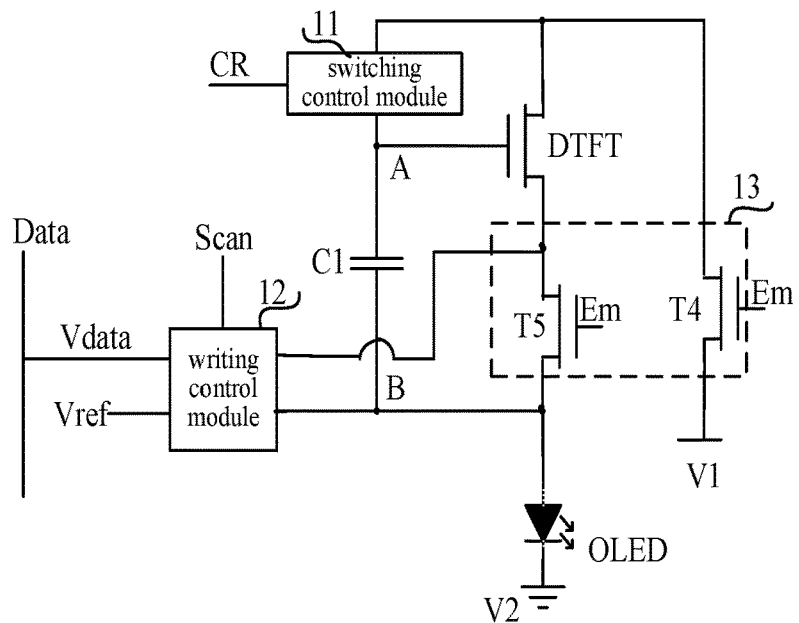
FIG. 2D is still yet another schematic view showing the pixel driving circuit according to some embodiments of the present disclosure.

To be specific, as shown in FIG. 2D, the light-emission control module includes: a first light-emission control transistor T4, a gate electrode of which is configured to receive the light-emission control signal Em, a first electrode of which is configured to receive the first power source voltage V1, and a second electrode of which is connected to the first electrode of the driving transistor DTFT; and a second light-emission control transistor T5, a gate electrode of which is configured to receive the light-emission control signal Em, a first electrode of which is connected to the second electrode of the driving transistor DTFT, and a second electrode of which is connected to the anode of the OLED.

In FIG. 2D, the first light-emission control transistor T4 and the second light-emission control transistor T5 are both n-type transistors.

Figure 2E:
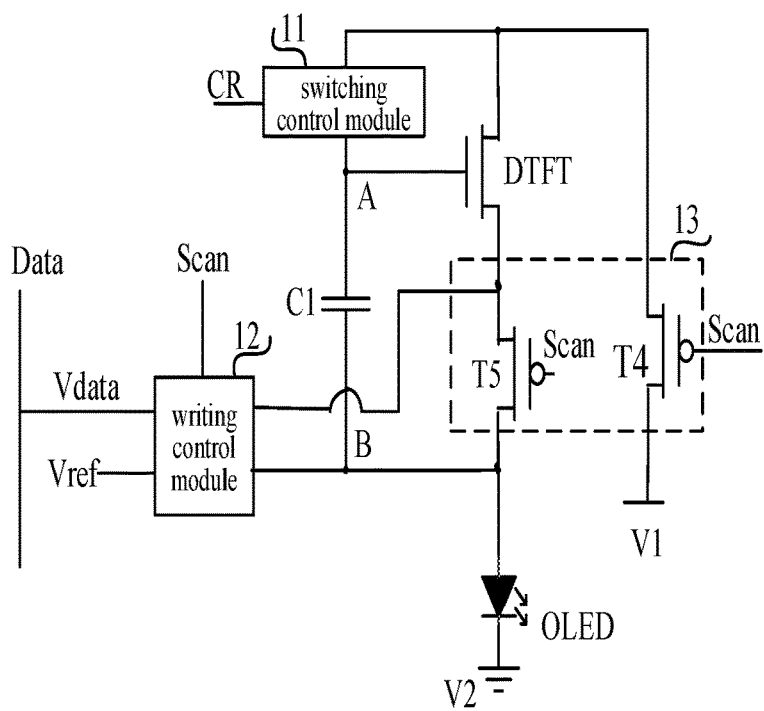
FIG. 2E is still yet another schematic view showing the pixel driving circuit according to some embodiments of the present disclosure.

To be specific, as shown in FIG. 2E, the light-emission control signal Em is the scanning signal Scan. The light-emission control module includes: a first light-emission control transistor T4, a gate electrode of which is configured to receive the scanning signal Scan, a first electrode of which is connected to the first electrode of the driving transistor DTFT, and a second electrode of which is configured to receive the first power source voltage V1; and a second light-emission control transistor T5, a gate electrode of which is configured to receive the scanning signal Scan, a first electrode of which is connected to the anode of the OLED, and a second electrode of which is connected to the second electrode of the driving transistor DTFT.

To be specific, in FIG. 2E, the first light-emission control transistor and the second light-emission control transistor are both p-type transistors.

All the transistors adopted in the embodiments of the present disclosure may be thin film transistors (TFTs), or field effect transistors (FETs) or any other elements having an identical characteristic. Apart from the gate electrode, the other two electrodes of each transistor may be called as a first electrode and a second electrode, which may be replaced with each other along with a change in a current direction. In other words, the first electrode may be a source electrode and the second electrode may be a drain electrode, or the first electrode may be a drain electrode and the second electrode may be a source electrode. In addition, depending on its characteristic, each transistor may be an n-type or a p-type transistor.

The pixel driving circuit will be described hereinafter in more details in conjunction with two embodiments.

Figure 3:
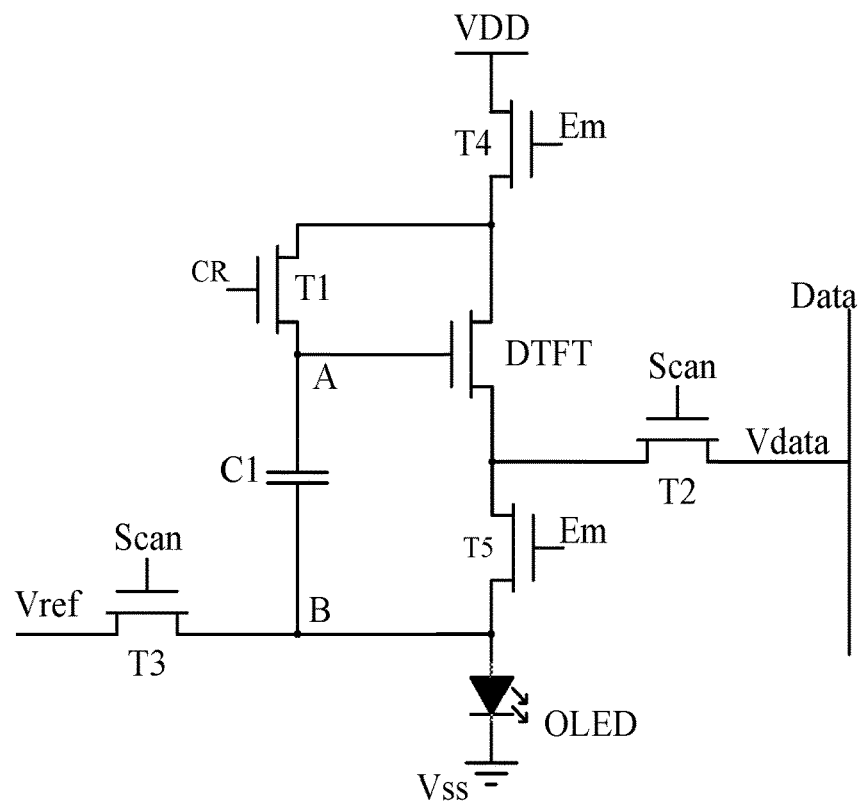
FIG. 3 is a circuit diagram of the pixel driving circuit according to some embodiments of the present disclosure.

As shown in FIG. 3, the pixel driving circuit may include a driving transistor DTFT, a storage capacitor C1, a switching control module, a writing control module and a light-emission control module. A first end A of the storage capacitor is connected to a gate electrode of the driving transistor DTFT. The switching control module includes a switching control transistor T1, a gate electrode of which is configured to receive a switching control signal CR, a drain electrode of which is connected to a drain electrode of the driving transistor DTFT, and a source electrode of which is connected to the gate electrode of the driving transistor DTFT. The writing control module includes: a data writing transistor T2, a gate electrode of which is configured to receive a scanning signal Scan, a drain electrode of which is connected to a data line Data for outputting a data voltage Vdata, and a source electrode of which is connected to a source electrode of the driving transistor DTFT; and a reference voltage writing transistor T3, a gate electrode of which is configured to receive the scanning signal Scan, a first electrode of which is connected to a second end B of the storage capacitor C1, and a second electrode of which is configured to receive the reference voltage Vref. The light-emission control module includes: a first light-emission control transistor T4, a gate electrode of which is configured to receive a light-emission control signal Em, a first electrode of which is configured to receive a high level VDD, and a second electrode of which is connected to the drain electrode of the driving transistor DTFT; and a second light-emission control transistor T5, a gate electrode of which is configured to receive the light-emission control signal Em, a first electrode of which is connected to the source electrode of the driving transistor DTFT, and a second electrode of which is connected to an anode of an OLED. A cathode of the OLED is configured to receive a low level VSS. The driving transistor DTFT, the switching control transistor T1, the data writing transistor T2, the reference voltage writing transistor T3, the first light-emission control transistor T4 and the second light-emission control transistor T5 are all n-type transistors.

Figure 4:
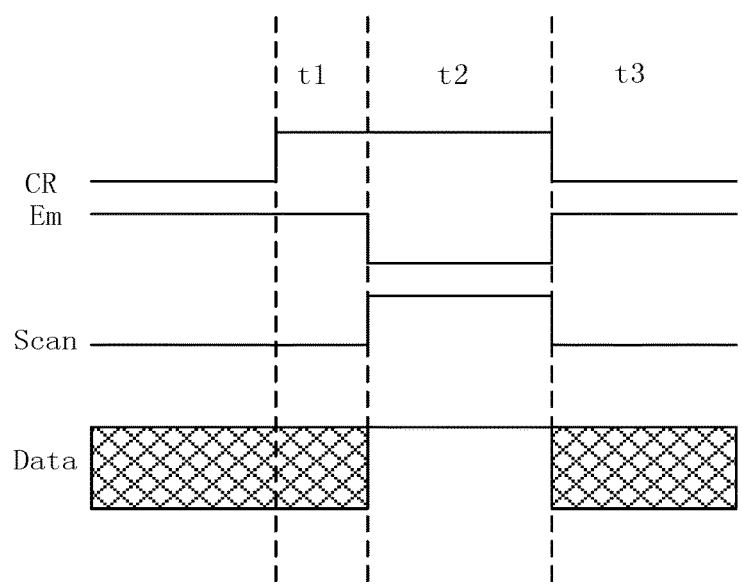
FIG. 4 is a sequence diagram of the pixel driving circuit according to some embodiments of the present disclosure.
Figure 5A:
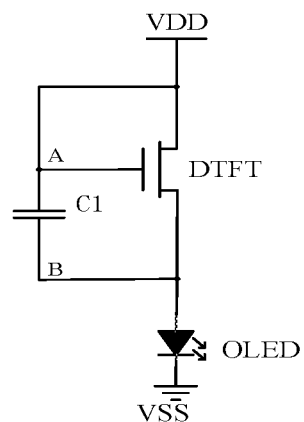
FIG. 5A is an equivalent circuit diagram of the pixel driving circuit at a threshold compensation stage t1 according to some embodiments of the present disclosure.

As shown in FIG. 4, during the operation of the pixel driving circuit in FIG. 3, at a threshold compensation stage t1, the switching control signal CR and the light-emission control signal Em are both at a high level, and the scanning signal Scan is at a low level, so as to turn on the switching control transistor T1, the first light-emission control transistor T4 and the second light-emission control transistor T5, and turn off the data writing transistor T2 and the reference voltage writing transistor T3. As shown in FIG. 5A, the driving transistor DTFT functions as a diode, and it is in a saturated state. At this time, a gate-to-source voltage Vgs of the driving transistor DTFT is a threshold voltage Vth of the driving transistor DTFT, a voltage at the first end A is the high level VDD, a voltage at the second end B is VDD−Vth, and a voltage difference between the first end A and the second end B of the storage capacitor C1 is equal to the threshold voltage Vth, and the threshold voltage Vth of the driving transistor DTFT is written into the storage capacitor C1.

Figure 5B:
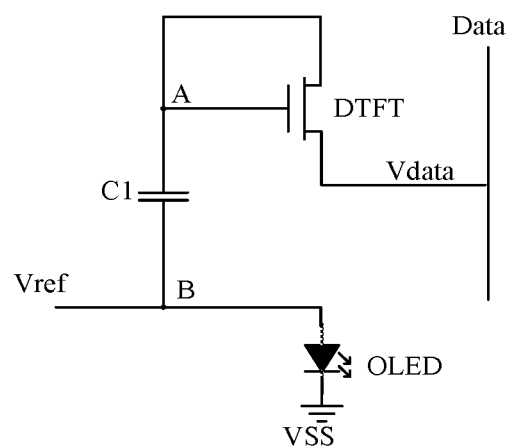
FIG. 5B is another equivalent circuit diagram of the pixel driving circuit at a writing stage t2 according to some embodiments of the present disclosure.

At a writing stage t2, the switching control signal CR and the scanning signal Scan are both at a high level, and the light-emission control signal Em is at a low level, so as to turn on the switching control transistor T1, the data writing transistor T2 and the reference voltage writing transistor T3, and turn off the first light-emission control transistor T4 and the second light-emission control transistor T5. As shown in FIG. 5B, the driving transistor DTFT is maintained as a diode. The gate-to-source voltage Vgs of the driving transistor DTFT is equal to the threshold voltage Vth, and the source electrode of the driving transistor DTFT is configured to receive the data voltage Vdata, so the voltage at the first end A is Vdata+Vth, and the voltage at the second end B is pulled down to the reference voltage Vref. The voltage difference between the first end A and the second end B of the storage capacitor C1 is Vdata+Vth−Vref, so the threshold voltage Vth of the driving transistor DTFT and the data voltage Vdata are written into the storage capacitor C1. At this time, through the reference voltage Vref, it is able to eliminate the voltage at the anode of the OLED within a previous frame.

Figure 5C:
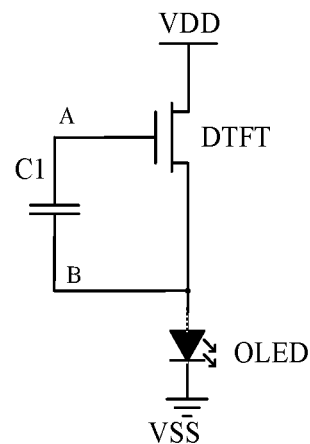
FIG. 5C is yet another equivalent circuit diagram of the pixel driving circuit at a light-emission maintenance stage t3 according to some embodiments of the present disclosure.

At a light-emission maintenance stage t3, the switching control signal CR and the scanning signal Scan are both at a low level, and the light-emission control signal Em is at a high level, so as to turn off the switching control transistor T1, the data writing transistor T2 and the reference voltage writing transistor T3, and turn on the first light-emission control transistor T4 and the second light-emission control transistor T5. As shown in FIG. 5C, the driving transistor DTFT is driven by the voltage at the first end A of the storage capacitor C1, so as to enable the OLED to emit light. The voltage VB at the second end B of the storage capacitor C1 is equal to an on-state voltage Voled of the OLED. Because the voltage difference between the two ends of the storage capacitor C1 cannot change suddenly, the voltage VA at the first end A of the storage capacitor C1 is Vdata+Vth−Vref+Voled.

For the gate-to-source voltage Vgs of the driving transistor DTFT, Vgs=VA−VB=Vdata+Vth−Vref. A current I flowing through the OLED (i.e., the driving current of the driving transistor DTFT) may be calculated as follows: $I=K\times(Vgs-Vth)^2=K\times(Vdata-Vref)^2$. At this time, the OLED is maintained in a light-emission state, and the current flowing through the OLED at the light-emission maintenance stage t3 is independent of the threshold voltage Vth. As a result, it is able to improve the current evenness, thereby to improve the display brightness.

In addition, in the case that the pixel driving circuit in FIG. 3 does not include the reference voltage writing transistor T3, i.e., in the case that the reference voltage Vref is not written into the second end B of the storage capacitor C1 at the writing stage t2, the voltage at the second end of the storage capacitor C1 is just the on-state voltage Voled of the OLED. In this regard, the gate-to-source voltage of the driving transistor DTFT may be related to the on-state voltage Voled of the OLED at the light-emission maintenance stage t3. The on-state voltage Voled may change along with the aging of the OLED, so the current flowing through the OLED may be adversely affected by the aging of the OLED. In the embodiments of the present disclosure, the reference voltage Vref is written into the second end of the storage capacitor C1 by the writing control module at the writing stage (the reference voltage writing transistor T3 is adopted in FIG. 3), so it is able to prevent the current flowing through the OLED from being adversely affected by the aging of the OLED.

To be specific, in the case that the reference voltage Vref is not written into the source electrode of the driving transistor DTFT at the writing stage t2 but the second end B of the storage capacitor C1 is directly electrically connected to the anode of the OLED, the voltage VB at the second end B of the storage capacitor c1 may be the on-state voltage Voled of the OLED at the writing stage, and the voltage difference between the first end A and the second end B of the storage capacitor C1 may be Vdata+Vth−Voled. Because the voltage difference between the two ends of the storage capacitor C1 cannot change suddenly, the voltage difference may be maintained as Vdata+Vth−Voled at the light-emission maintenance stage. In this regard, the driving current of the driving transistor for driving the OLED to emit light may be related to the on-state voltage Voled of the OLED, and the driving current may be adversely affected by the aging of the OLED.

Figure 6:
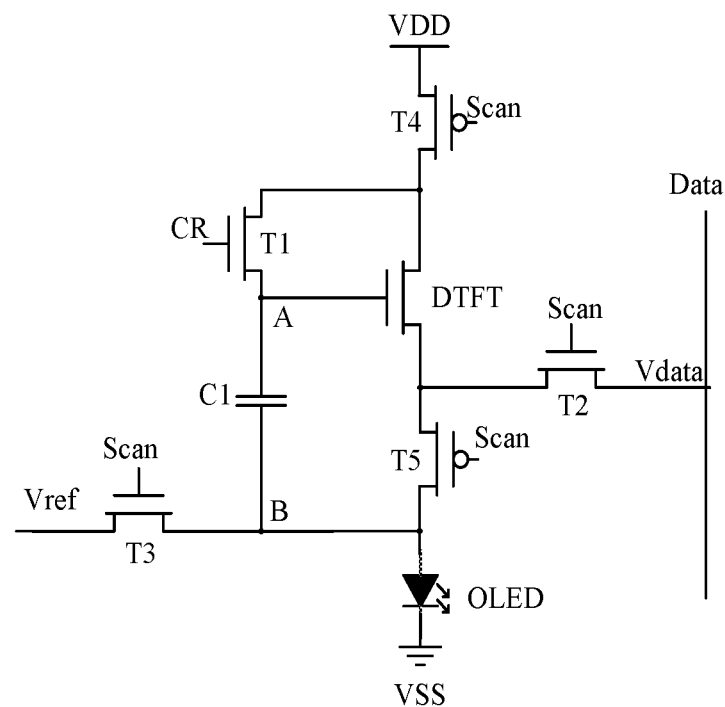
FIG. 6 is another circuit diagram of the pixel driving circuit according to some embodiments of the present disclosure.

As shown in FIG. 6, the present disclosure further provides in some embodiments a pixel driving circuit, which includes a driving transistor DTFT, a storage capacitor C1, a switching control module, a writing control module and a light-emission control module.

A first end A of the storage capacitor is connected to a gate electrode of the driving transistor DTFT. The switching control module includes a switching control transistor T1, a gate electrode of which is configured to receive a switching control signal CR, a drain electrode of which is connected to a drain electrode of the driving transistor DTFT, and a source electrode of which is connected to the gate electrode of the driving transistor DTFT. The writing control module includes: a data writing transistor T2, a gate electrode of which is configured to receive a scanning signal Scan, a drain electrode of which is connected to a data line Data for outputting a data voltage Vdata, and a source electrode of which is connected to a source electrode of the driving transistor DTFT; and a reference voltage writing transistor T3, a gate electrode of which is configured to receive the scanning signal Scan, a first electrode of which is connected to a second end B of the storage capacitor C1, and a second electrode of which is configured to receive a reference voltage Vref.

The light-emission control module includes: a first light-emission control transistor T4, a gate electrode of which is configured to receive the scanning signal Scan, a source electrode of which is connected to the drain electrode of the driving transistor DTFT, and a drain electrode of which is configured to receive a high level VDD; and a second light-emission control transistor T5, a gate electrode of which is configured to receive the scanning signal Scan, a source electrode of which is connected to an anode of an OLED, and a drain electrode of which is connected to the source electrode of the driving transistor DTFT. The driving transistor DTFT, the switching control transistor T1, the data writing transistor T2 and the reference voltage writing transistor T3 are all n-type transistors, and the first light-emission control transistor T4 and the second light-emission control transistor T5 are both p-type transistors.

Figure 7:
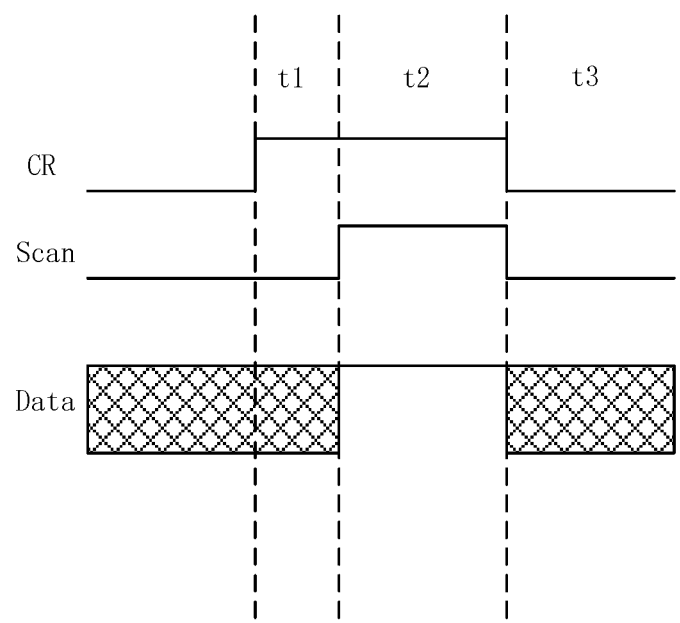
FIG. 7 is another sequence diagram of the pixel driving circuit according to some embodiments of the present disclosure.

As shown in FIG. 7, during the operation of the pixel driving circuit in FIG. 6, at a threshold compensation stage t1, the switching control signal CR is at a high level, and the scanning signal Scan is at a low level, so as to turn on the switching control transistor T1, the first light-emission control transistor T4 and the second light-emission control transistor T5, and turn off the data writing transistor T2 and the reference voltage writing transistor T3. The driving transistor DTFT functions as a diode, and it is in a saturated state. At this time, a gate-to-source voltage Vgs of the driving transistor DTFT is a threshold voltage Vth of the driving transistor DTFT, a voltage at the first end A is the high level VDD, a voltage at the second end B is VDD−Vth, and a voltage difference between the first end A and the second end B of the storage capacitor C1 is the threshold voltage Vth, so the threshold voltage Vth of the driving transistor DTFT is written into the storage capacitor C1.

At a writing stage t2, the switching control signal CR and the scanning signal Scan are both at a high level, so as to turn on the switching control transistor T1, the data writing transistor T2 and the reference voltage writing transistor T3, and turn off the first light-emission control transistor T4 and the second light-emission control transistor T5. As shown in FIG. 5B, the driving transistor DTFT is maintained as a diode. The gate-to-source voltage Vgs of the driving transistor DTFT is the threshold voltage Vth, the source electrode of the driving transistor DTFT is configured to receive the data voltage Vdata, so the voltage at the first end A is Vdata+Vth. The voltage at the second end B is pulled down to the reference voltage Vref, so the voltage difference between the first end A and the second end B of the storage capacitor C1 is Vdata+Vth−Vref, and the threshold voltage Vth of the driving transistor DTFT and the data voltage Vdata are written into the storage capacitor C1. At this time, through the reference voltage Vref, it is able to eliminate a voltage at an anode of an OLED within a previous frame.

At a light-emission maintenance stage t3, the switching control signal CR and the scanning signal Scan are both at a low level, so as to turn off the switching control transistor T1, the data writing transistor T2 and the reference voltage writing transistor T3, and turn on the first light-emission control transistor T4 and the second light-emission control transistor T5. As shown in FIG. 5C, the driving transistor DTFT is driven by the voltage at the first end A of the storage capacitor C1, so as to enable the OLED to emit light. The voltage VB at the second end B of the storage capacitor C1 is equal to an on-state voltage Voled of the OLED. Because the voltage difference between the two ends of the storage capacitor C1 cannot change suddenly, the voltage VA at the first end A of the storage capacitor C1 is Vdata+Vth−Vref+Voled.

For the gate-to-source voltage Vgs of the driving transistor DTFT, Vgs=VA−VB=Vdata+Vth−Vref. A current I flowing through the OLED (i.e., the driving current of the driving transistor DTFT) may be calculated as follows: $I=K\times(Vgs-Vth)^2=K\times(Vdata-Vref)^2$. At this time, the OLED is maintained in a light-emission state, and the current flowing through the OLED at the light-emission maintenance stage t3 is independent of the threshold voltage Vth. As a result, it is able to improve the current evenness, thereby to improve evenness of the display brightness.

In addition, in the case that the pixel driving circuit in FIG. 6 does not include the reference voltage writing transistor T3, i.e., in the case that the reference voltage Vref is not written into the second end B of the storage capacitor C1 at the writing stage t2, the voltage at the second end of the storage capacitor C1 is just the on-state voltage Voled of the OLED. In this regard, the gate-to-source voltage of the driving transistor DTFT may be related to the on-state voltage Voled of the OLED at the light-emission maintenance stage t3. The on-state voltage Voled may change along with the aging of the OLED, so the current flowing through the OLED may be adversely affected by the aging of the OLED. In the embodiments of the present disclosure, the reference voltage Vref is written into the second end of the storage capacitor C1 by the writing control module at the writing stage (the reference voltage writing transistor T3 is adopted in FIG. 6), so it is able to prevent the current flowing through the OLED from being adversely affected by the aging of the OLED.

The present disclosure further provides in some embodiments a pixel driving method for the above-mentioned pixel driving circuit, which includes: a threshold compensation step of, at a threshold compensation stage of each display period, enabling the switching control signal and the light-emission control signal to be effective (the effective signal are used to turn on the corresponding modules), enabling both the switching control module and the light-emission control module to be in an on state, and enabling the driving transistor to function as a diode, so as to compensate for a threshold voltage Vth of the driving transistor through a voltage difference between the first end and the second end of the storage capacitor; a writing step of, at a writing stage of each display period, enabling the switching control signal and the scanning signal to be effective, enabling both the switching control module and the light-emission control module to be in the on state, and maintaining the driving transistor to function as the diode, so as to write a data voltage Vdata from the data line into the first end of the storage capacitor through the driving transistor, and write a reference voltage Vref into the second end of the storage capacitor; and a light-emission step of, at a light-emission maintenance stage of each display period, enabling the light-emission control signal to be effective, and enabling the light-emission control module to be in the on state, so as to enable the driving transistor to be in the on state through charges stored in the storage capacitor, thereby to drive the light-emitting element to emit light.

According to the pixel driving method in the embodiments of the present disclosure, the threshold voltage Vth of the driving transistor and the data voltage Vdata from the data line may be written separately into the storage capacitor through the switching control module and the writing control module, so as to enable a gate-to-source voltage of the driving transistor to include Vdata+Vth and enable the driving current of the driving transistor to be independent of the threshold voltage Vth of the driving transistor at the light-emission maintenance stage, thereby to provide the even brightness. In addition, the reference voltage may be written into the second end of the storage capacitor through the writing control module at the writing stage, so as to enable the driving current of the driving transistor to be independent of the on-state voltage of the light-emitting element at the light-emission maintenance stage, thereby to prevent the driving current of the driving transistor from being adversely affected by the aging of the light-emitting element at the light-emission maintenance stage.

In a possible embodiment of the present disclosure, the threshold compensation stage is maintained for a time period smaller than a predetermined value. At the threshold compensation stage, the light-emitting element is driven by the driving transistor in the saturated state to emit light, so the time period of the threshold compensation stage needs to be reduced as possible, so as to improve a display effect.

The present disclosure further provides in some embodiments a display panel including the above-mentioned pixel driving circuit.

The present disclosure further provides in some embodiments a display device including the above-mentioned display panel.

The display device may be any product or member having a display function, such as an electronic paper, an OLED display device, a mobile phone, a tablet computer, a television, a display, a laptop computer, a digital photo frame or a navigator.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A pixel driving circuit, comprising a driving transistor, a storage capacitor, a switching control module, a writing control module and a light-emission control module, wherein
   a gate electrode of the driving transistor is connected to a first electrode of the driving transistor through the switching control module, the first electrode of the driving transistor is configured to receive a first power source voltage through the light-emission control module, and a second electrode of the driving transistor is connected to a light-emitting element through the light-emission control module and connected to a data line through the writing control module;
   a first end of the storage capacitor is connected to the gate electrode of the driving transistor, and a second end the storage capacitor is connected to the second electrode of the driving transistor through the light-emission control module and configured to receive a reference voltage through the writing control module;
   the switching control module is configured to receive a switching control signal and enable, at a threshold compensation stage and a writing stage of each display period, the gate electrode of the driving transistor to be electrically connected to the first electrode of the driving transistor under the control of the switching control signal, so as to enable the driving transistor to function as a diode, thereby to write a threshold voltage of the driving transistor into the storage capacitor;
   the writing control module is configured to receive a scanning signal and enable, at the writing stage of each display period under the control of the scanning signal, to write a data voltage from the data line into the second electrode of the driving transistor, and write the reference voltage into the second end of the storage capacitor; and
   the light-emission control module is configured to receive a light-emission control signal and enable, at the threshold compensation stage and a light-emission maintenance stage of each display period under the control of the light-emission control signal, the first electrode of the driving transistor to receive the first power source voltage, and the second electrode of the driving transistor to be electrically connected to the light-emitting element, wherein the light-emission control module consists of: a first light-emission control transistor, wherein a gate electrode of the first light-emission control transistor is configured to receive the light-emission control signal, a first electrode of the first light-emission control transistor is configured to receive the first power source voltage, and a second electrode of the first light-emission control transistor is connected to the first electrode of the driving transistor; and a second light-emission control transistor, wherein a gate electrode of the second light-emission control transistor is configured to receive the light-emission control signal, a first electrode of the second light-emission control transistor is connected to the second electrode of the driving transistor, and a second electrode of the second light-emission control transistor is connected to the light-emitting element.

2. The pixel driving circuit according to claim 1, wherein the light-emitting element comprises an organic light-emitting diode (OLED), an anode of the OLED is connected to the second end of the storage capacitor, and a cathode of the OLED is configured to receive a second power source voltage; and at the writing stage of each display period, the reference voltage is smaller than or equal to the second power source voltage.

3. The pixel driving circuit according to claim 1, wherein the switching control module comprises a switching control transistor, a gate electrode of the switching control transistor is configured to receive the switching control signal, a first electrode of the switching control transistor is connected to the first electrode of the driving transistor, and a second electrode of the switching control transistor is connected to the gate electrode of the driving transistor.

4. The pixel driving circuit according to claim 3, wherein the writing control module comprises:
   a data writing transistor, wherein a gate electrode of the data writing transistor is configured to receive the scanning signal, a first electrode of the data writing transistor is connected to the data line, and a second electrode of the data writing transistor is connected to the second electrode of the driving transistor; and
   a reference voltage writing transistor, wherein a gate electrode of the reference voltage writing transistor is configured to the scanning signal, a first electrode of the reference voltage writing transistor is connected to the second end of the storage capacitor, and a second electrode of the reference voltage writing transistor is configured to receive the reference voltage.

5. The pixel driving circuit according to claim 4, wherein the driving transistor, the switching control transistor, the data writing transistor, the reference voltage writing transistor, the first light-emission control transistor and the second light-emission control transistor are all n-type transistors.

6. The pixel driving circuit according to claim 4, wherein the light-emission control signal is the scanning signal; and
   the light-emission control module comprises a first light-emission control transistor and a second light-emission control transistor, a gate electrode of the first light-emission control transistor is configured to receive the scanning signal, a first electrode of the first light-emission control transistor is connected to the first electrode of the driving transistor, a second electrode of the first light-emission control transistor is configured to receive the first power source voltage, a gate electrode of the second light-emission control transistor is configured to receive the scanning signal, a first electrode of the second light-emission control transistor is connected to the light-emitting element, and a second electrode of the second light-emission control transistor is connected to the second electrode of the driving transistor.

7. The pixel driving circuit according to claim 6, wherein the driving transistor, the switching control transistor, the data writing transistor and the reference voltage writing transistor are all n-type transistors, and the first light-emission control transistor and the second light-emission control transistor are both p-type transistors.

8. The pixel driving circuit according to claim 6, wherein the switching control transistor, the data writing transistor and the reference voltage writing transistor are all n-type transistors, and the driving transistor, the first light-emission control transistor and the second light-emission control transmission are all p-type transistors.

9. A pixel driving method for the pixel driving circuit according to claim 1, comprising:
   a threshold compensation step of, at a threshold compensation stage of each display period, enabling the switching control signal and the light-emission control signal to be effective, enabling both the switching control module and the light-emission control module to be in an on state, and enabling the driving transistor to function as a diode, so as to compensate for a threshold voltage Vth of the driving transistor through a voltage difference between the first end and the second end of the storage capacitor;
   a writing step of, at a writing stage of each display period, enabling the switching control signal and the scanning signal to be effective, enabling both the switching control module and the light-emission control module to be in the on state, maintaining the driving transistor to function as the diode, writing a data voltage Vdata from the data line into the first end of the storage capacitor through the driving transistor, and writing a reference voltage Vref into the second end of the storage capacitor; and
   a light-emission step of, at a light-emission maintenance stage of each display period, enabling the light-emission control signal to be effective, enabling the light-emission control module to be in the on state, and enabling the driving transistor to be in the on state through charges stored in the storage capacitor to drive the light-emitting element to emit light.

10. The pixel driving method according to claim 9, wherein the threshold compensation stage is maintained for a time period smaller than a predetermined value.

11. A display panel, comprising the pixel driving circuit according to claim 1.

12. A display device, comprising the display panel according to claim 11.

13. The pixel driving circuit according to claim 2, wherein the switching control module comprises a switching control transistor, a gate electrode of the switching control transistor is configured to receive the switching control signal, a first electrode of the switching control transistor is connected to the first electrode of the driving transistor, and a second electrode of the switching control transistor is connected to the gate electrode of the driving transistor.

14. The pixel driving circuit according to claim 13, wherein the writing control module comprises:
   a data writing transistor, wherein a gate electrode of the data writing transistor is configured to receive the scanning signal, a first electrode of the data writing transistor is connected to the data line, and a second electrode of the data writing transistor is connected to the second electrode of the driving transistor; and
   a reference voltage writing transistor, wherein a gate electrode of the reference voltage writing transistor is configured to the scanning signal, a first electrode of the reference voltage writing transistor is connected to the second end of the storage capacitor, and a second electrode of the reference voltage writing transistor is configured to receive the reference voltage.

15. The pixel driving circuit according to claim 14, wherein the light-emission control module comprises:
   a first light-emission control transistor, wherein a gate electrode of the first light-emission control transistor is configured to receive the light-emission control signal, a first electrode of the first light-emission control transistor is configured to receive the first power source voltage, and a second electrode of the first light-emission control transistor is connected to the first electrode of the driving transistor; and
   a second light-emission control transistor, wherein a gate electrode of the second light-emission control transistor is configured to receive the light-emission control signal, a first electrode of the second light-emission control transistor is connected to the second electrode of the driving transistor, and a second electrode of the second light-emission control transistor is connected to the light-emitting element.

16. The pixel driving circuit according to claim 15, wherein the driving transistor, the switching control transistor, the data writing transistor, the reference voltage writing transistor, the first light-emission control transistor and the second light-emission control transistor are all n-type transistors.

17. The pixel driving circuit according to claim 14, wherein the light-emission control signal is the scanning signal; and the light-emission control module comprises a first light-emission control transistor and a second light-emission control transistor, a gate electrode of the first light-emission control transistor is configured to receive the scanning signal, a first electrode of the first light-emission control transistor is connected to the first electrode of the driving transistor, a second electrode of the first light-emission control transistor is configured to receive the first power source voltage, a gate electrode of the second light-emission control transistor is configured to receive the scanning signal, a first electrode of the second light-emission control transistor is connected to the light-emitting element, and a second electrode of the second light-emission control transistor is connected to the second electrode of the driving transistor.

18. The pixel driving circuit according to claim 17, wherein the driving transistor, the switching control transistor, the data writing transistor and the reference voltage writing transistor are all n-type transistors, and the first light-emission control transistor and the second light-emission control transistor are both p-type transistors.

19. The pixel driving circuit according to claim 17, wherein the switching control transistor, the data writing transistor and the reference voltage writing transistor are all n-type transistors, and the driving transistor, the first light-emission control transistor and the second light-emission control transmission are all p-type transistors.

* * * * *